United States Patent
Ho et al.

(10) Patent No.: US 7,030,504 B2
(45) Date of Patent: Apr. 18, 2006

(54) SECTIONAL MOLDING SYSTEM

(75) Inventors: Shu Chuen Ho, Singapore (SG); Jie Liu, Singapore (SG); See Yap Ong, Singapore (SG)

(73) Assignee: ASM Technology Singapore PTE Ltd., Singapore (SG)

( * ) Notice: Subject to any disclaimer, the term of this patent is extended or adjusted under 35 U.S.C. 154(b) by 0 days.

(21) Appl. No.: 10/449,938

(22) Filed: May 30, 2003

(65) Prior Publication Data

US 2004/0238972 A1 Dec. 2, 2004

(51) Int. Cl.
*H01L 23/28* (2006.01)

(52) U.S. Cl. ............................... 257/787; 257/678

(58) Field of Classification Search .......... 257/678, 257/787, 790; 438/111, 112, 123–127, 106, 438/107, 110, 113, 114; 264/272.17
See application file for complete search history.

(56) References Cited

U.S. PATENT DOCUMENTS

| | | | |
|---|---|---|---|
| 6,114,189 A | * | 9/2000 | Chia et al. .................. 438/112 |
| 6,508,970 B1 | * | 1/2003 | Chandra ................ 264/272.17 |
| 2004/0077130 A1 | * | 4/2004 | Ho et al. .................... 438/126 |

FOREIGN PATENT DOCUMENTS

JP      10-202669     *   4/1998

* cited by examiner

*Primary Examiner*—Hoai Pham
*Assistant Examiner*—Dilinh Nguyen
(74) *Attorney, Agent, or Firm*—Ostrolenk, Faber, Gerb & Soffen, LLP

(57) ABSTRACT

The invention provides a molding system for encapsulating a piece of substrate having a plurality of molding sections. The system comprises a molding device operative to separately encapsulate each molding section with a molding compound and indexing means operative to position said molding sections of the substrate relative to the molding device for encapsulation.

15 Claims, 3 Drawing Sheets

SECTIONAL MOLDING SYSTEM

FIELD OF THE INVENTION

The invention relates to a system for molding electronic components mounted on substrates with encapsulating material during a semiconductor assembly process.

BACKGROUND AND PRIOR ART

Semiconductor manufacturing involves various processes, such as mounting a plurality of semiconductor dice to a substrate, forming electrical connections between the dice and the substrate, encapsulating the dice and substrate with a plastic encapsulating material, such as epoxy resin, and separating each molded electronic component from one another to form individual semiconductor packages.

The electronic components are encapsulated using a molding process. During this process, the substrate is introduced into a mold cavity formed by two mold halves. The substrate is sandwiched between the mold halves with the semiconductor dice positioned in corresponding cavities of the mold. Encapsulating material is introduced into the cavities and is allowed to set and harden. The mold halves are then opened, the encapsulating material is allowed to cure, and the cull and other unwanted encapsulating material are then removed in a degating process.

Conventionally, the mold halves are designed to accommodate and mold all the plurality of semiconductor dice on a substrate at the same time. Whilst this conventional method is a simple molding method, and has been used for many years, there are several disadvantages associated with its use. Since mold chases comprised in the mold halves have larger areas to accommodate an entire array of semiconductor dice on the substrate, they require larger presses and higher clamping tonnage to secure the molding areas and provide a better sealing effect to prevent encapsulating material from leaking during the molding process. Also, since there are more semiconductor dice to be molded in one molding cycle, it requires a more complex mold chase design comprising runners and mold cavities to properly channel the encapsulating material to each die position for effective molding. The use of the mold chase may be more expensive because a new mold chase design would be required to cater to each substrate length and width. Even if the basic patterns of the dice arrangements are the same, a new mold chase would be necessary for, say, a longer length of substrate. All these factors lead to increased costs in the implementations of conventional molding systems.

Prior art molding systems also require pick-and-place transfer mechanisms for substrates, pre-heaters before molding and curing ovens after molding. This involves more complexity in operation and generally higher equipment cost to support the molding operation. Further, each molding shot to mold a whole substrate normally consumes seven to eight epoxy resin pellets. A fast pellet preparation turnaround time is therefore required.

SUMMARY OF THE INVENTION

The invention seeks to provide a molding system that avoids some of the disadvantages that have been found with conventional molding systems, by sectional molding of a substrate.

According to a first aspect of the invention, there is provided a molding system for encapsulating a piece of substrate having a plurality of molding sections comprising: a molding device operative to separately encapsulate each molding section with a molding compound; and indexing means operative to position said molding sections of the substrate relative to the molding device for encapsulation.

According to a second aspect of the invention, there is provided a method for encapsulating a piece of substrate having a plurality of molding sections comprising the steps of: positioning said molding sections of the substrate relative to a molding device for encapsulation; and separately encapsulating each molding section with a molding compound.

It will be convenient to hereinafter describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

An example of a preferred embodiment of a sectional molding system in accordance with the invention will now be described with reference to the accompanying drawings, in which.

DETAILED DESCRIPTION OF THE PREFERRED EMBODIMENT

Figure 1:
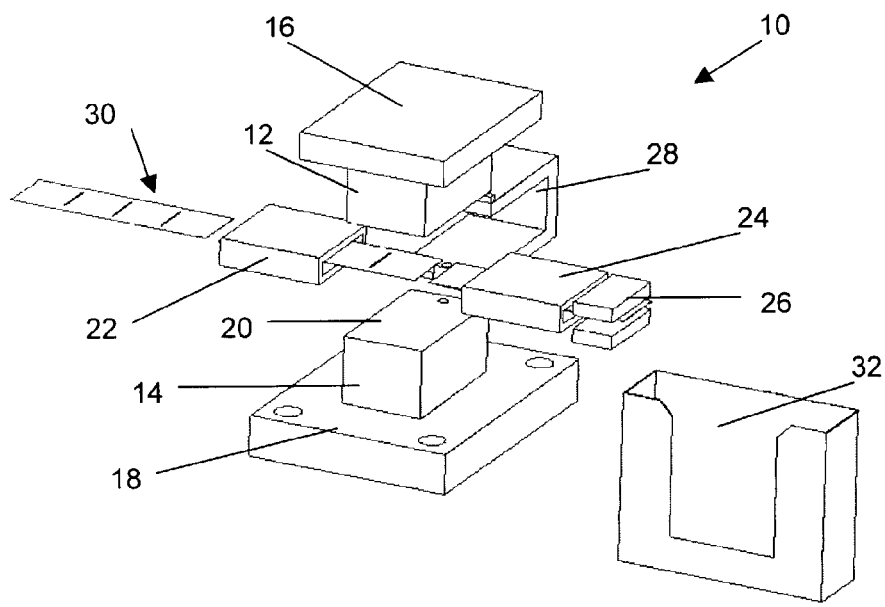
FIG. 1 is a schematic illustration of a sectional molding system according to the preferred embodiment of the invention.

FIG. 1 is a schematic illustration of a sectional molding system 10 according to the preferred embodiment of the invention. The molding system 10 generally comprises a molding device in the form of a top mold housing 12 and bottom mold housing 14 attached to a top mold platen 16 and bottom mold platen 18 respectively. The top mold housing 12 includes a top molding surface in the form of a top mold chase (not shown), which cooperates with a bottom molding surface in the form of a bottom mold chase 20 housed in the bottom mold housing 14 during molding to form molded semiconductor packages.

The molding system preferably includes temperature control passages, such as first and second heat tunnels 22, 24 respectively at either side of the mold housings 12, 14, a degating station 26 and a mold cleaner 28. The temperature control passages are operative to bring pieces of substrates 30 to a predetermined temperature, such as by heating when molding with epoxy resin. Thus, substrates 30 are prepared for molding by preheating them in the first heat tunnel 22 during transportation through the tunnel 22 to prepare them for molding, before the substrates 30 are positioned over the bottom mold chase 20 for molding. After molding, the substrates 30 are passed through the second heat tunnel 24 during transportation through the tunnel 24 for post-mold curing. After curing, the substrates 30 enter the degating station 26 to remove unwanted cull and runner material formed during molding. Thereafter, a stack magazine 32 may be used to receive and store substrates 30 that have been molded. Other equipment may be positioned adjacent to the molding system 10 depending on what is to be done with the substrates 30 after molding. The mold cleaner 28, which would typically include brushes and vacuum suction means, may move over the surfaces of the top and bottom mold chases to clean them after each substrate 30 has been molded.

Figure 2:
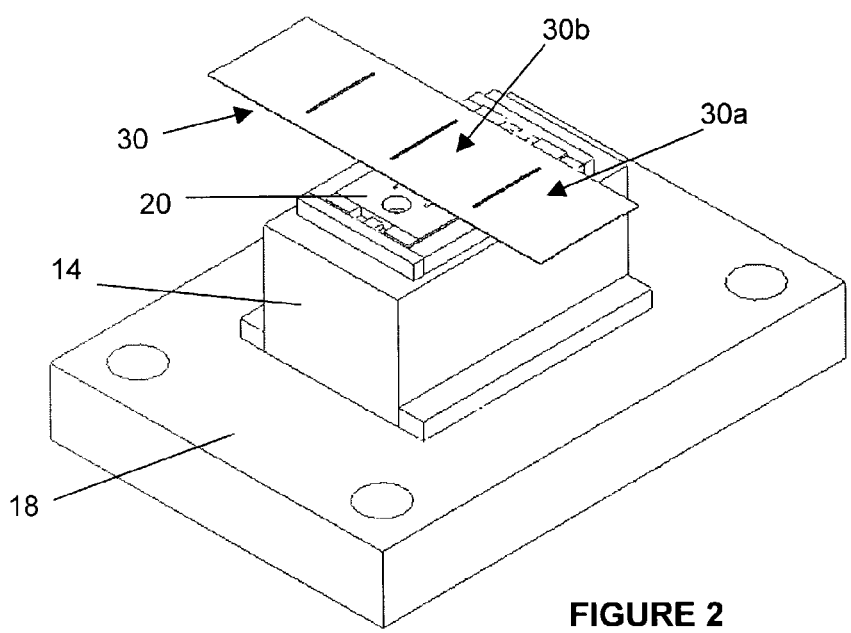
FIG. 2 is a perspective view of a piece of substrate located over a lower mold half of the molding system of FIG. 1.

FIG. 2 is a perspective view of a piece of substrate 30 located over a lower mold half of the molding system 10 of FIG. 1. The piece of substrate 30 may be in any form suitable for mounting semiconductor dice, such as a leadframes or printed circuit boards or film. The lower mold half includes the bottom mold housing 14 incorporating the bottom mold chase 20. The bottom mold housing 14 is attached to the bottom mold platen 18. The substrate 30 is divisible into a plurality of molding sections that may be separately encapsulated by the molding device. In the illustration of FIG. 2, the substrate 30 is divided into four sections or portions for sectional molding. In the illustration, the substrate 30 is movable generally from left to right of the drawing, such that a molded portion 30a has been formed on the right side of the substrate 30 that has been molded. There is a molding portion 30b positioned over the bottom mold chase 20 that is to be molded. The bottom mold chase 20 is designed to substantially enclose the bottom surface of the molding portion 30b. Similarly, the top mold chase is designed to substantially enclose the top surface of the molding portion. Subsequent sections of the substrate 30 will be moved over the bottom mold chase 20 to be molded in turn.

Figures 3, 3A, 3B:
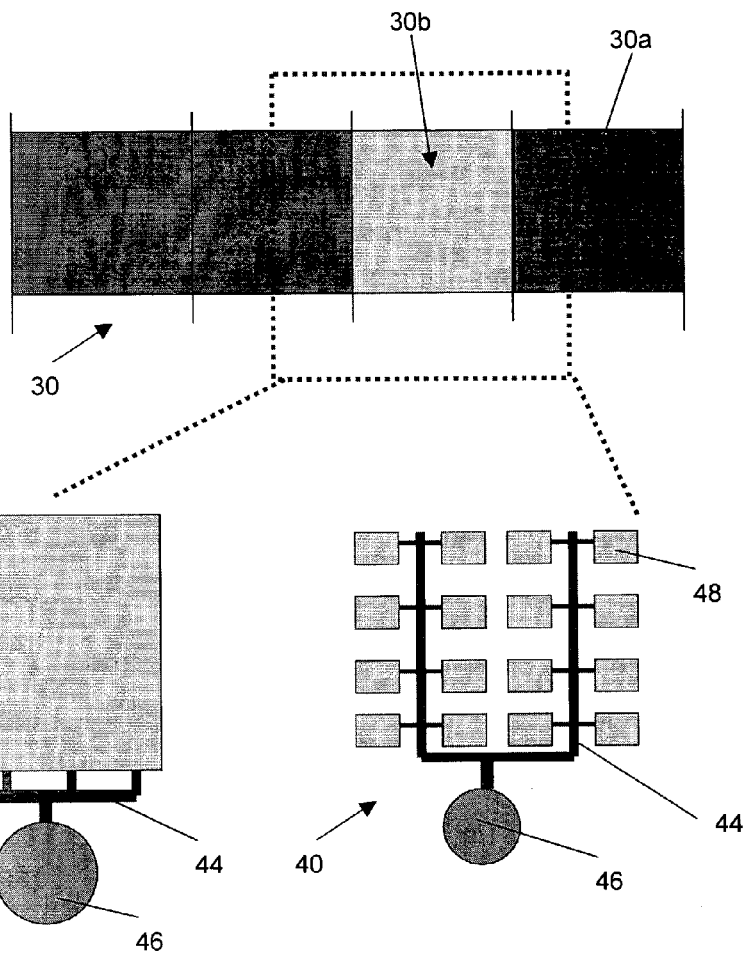
FIG. 3 illustrates exemplary molding designs that may be formed by the molding system on molding sections of a substrate.

FIG. 3 illustrates exemplary molding designs that may be formed by the molding system 10 on molding sections of the substrate 30. The substrate 30 has been divided into four sections or portions, including the molded portion 30a, and the molding portion 30b to the left of the molded portion 30a. The molding system 10 is designed such that in this embodiment, it molds each of the four molding portions of the substrate 30 separately. In FIG. 3(a), the portion of substrate 30 has been molded in block form. The molded substance 38 formed from the molding surfaces or mold chases comprises a block of molding material 42 covering a majority of the molding portion 30b of the substrate 30, runner material 44 and cull material 46. In FIG. 3(b), the substrate has been molded in matrix array form. The molded substance 40 formed from the molding surfaces or mold chases comprises an array of molding material covering individual semiconductor dice in the form of individual molded packages 48, runner material 44 and cull material 46.

Figure 4:
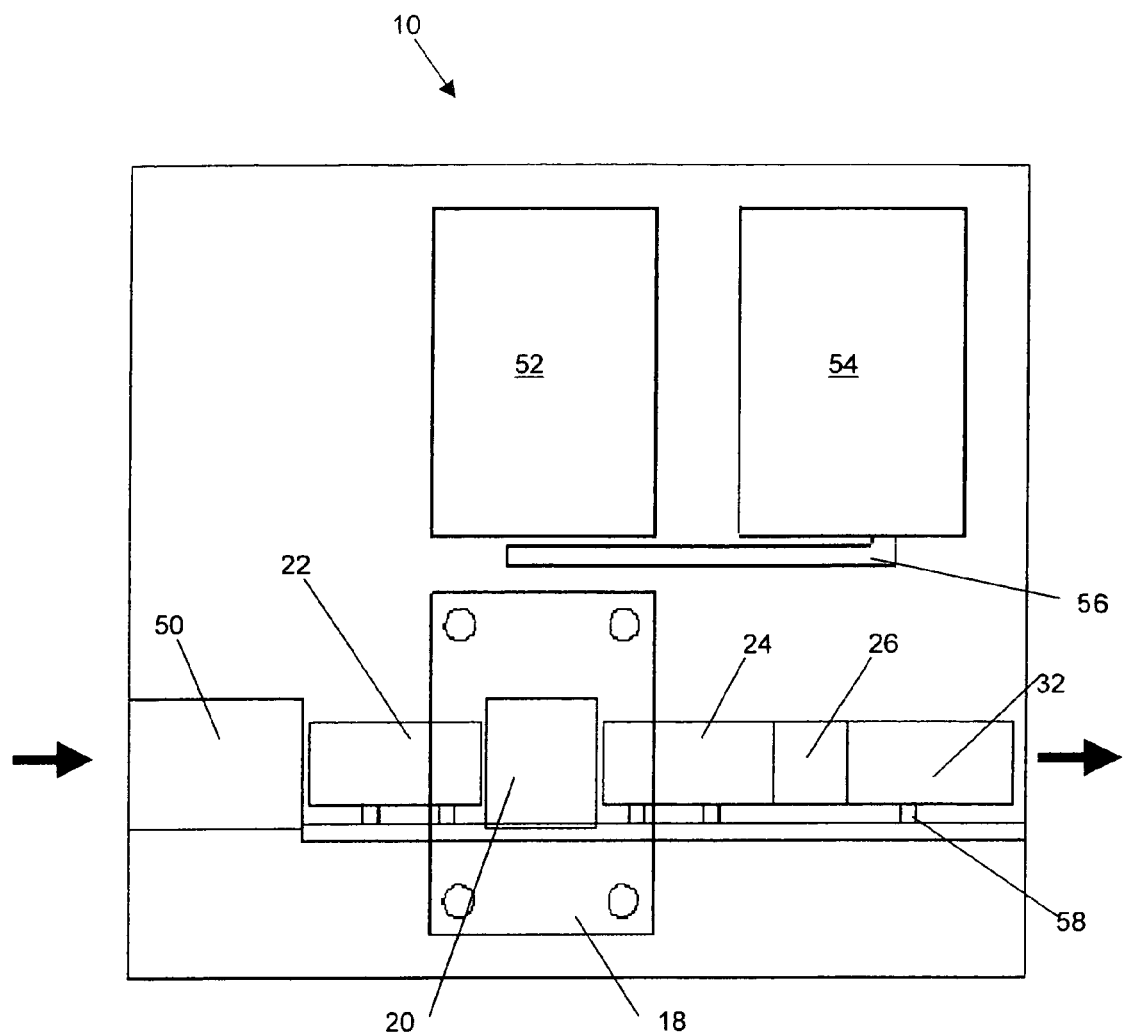
FIG. 4 is a top view of the molding system according to the preferred embodiment of the invention.

FIG. 4 is a top view of the molding system 10 according to the preferred embodiment of the invention. Substrates 30 are introduced into an input buffer 50 from one side of a molding machine incorporating the molding system 10. Substrates 30 are moved into the first heat tunnel 22 for preheating, and thereafter into a position over the bottom mold chase 20 for molding. Where the encapsulating material is epoxy resin, the pellet carrier 52 carries resin pellets to a pellet compartment 54 for storage. When required, pellets are moved through a pellet feed 56 to a location where they may be heated and compressed to produce fluid epoxy resin material to enter mold cavities of the mold chases during molding of each portion of the substrates 30.

As mentioned above, the substrates 30 are molded portion by portion, and after molding, are moved into the second heat tunnel 24 for post-mold curing. After curing, they are moved into the degating station 26 to remove runner material 44 and cull 46. After degating, the substrates 30 may then be stored in a stack magazine to undergo further processes, for example, for singulation by sawing.

The molding system preferably uses indexing means to move the substrates 30 along a traveling path through the various parts of the molding system 10, and to position the molding sections of the substrates 30 relative to the molding device for encapsulation. The indexing means preferably extend adjacent to the molding device and is substantially parallel with the traveling path of the substrates 30, as shown in FIG. 4. A suitable indexing means is a clamp or pin indexer 58. A clamp indexer comprises a clamping device to grip a side of a substrate 30 and moves it along the traveling path by coordinated clamping and unclamping action. On the other hand, a pin indexer comprises a pin to locate into a corresponding pinhole formed in the substrate 30 to push it along the traveling path. Either of these would be suitable for use with the invention.

It should be appreciated that the molding system 10 as described significantly reduces press clamping tonnage required to mold a plurality of electronic components on a substrate 30, thereby minimizing the cost and size of a mold press. With a reduced number of electronic components molded in one molding cycle, tooling investment can also be reduced by simplifying the design of a mold chase used. Furthermore, the molding system may flexibly be programmable for various substrate widths. Overall, a shorter machine time may be achieved due to various factors, such as a shorter cure time required by using a post-cure heat tunnel 24, and by cleaning the mold chase after each completed strip of substrate 30 has been molded.

In addition, complicated pick-and-place transfer mechanisms for substrates, pre-heaters before molding and curing ovens after molding are not necessary due to the use of indexing means and heat tunnels 22, 24. Only two epoxy resin pellets may be consumed for each mold shot, as compared to seven or eight consumed for conventional molding systems, thereby reducing demands on pellet preparation turnaround time.

The invention described herein is susceptible to variations, modifications and/or additions other than those specifically described and it is to be understood that the invention includes all such variations, modifications and/or additions which fall within the spirit and scope of the above description.

The invention claimed is:

1. A molding system for encapsulating a plurality of semiconductor devices mounted on a single substrate, the system comprising:
   a molding device having a single molding cavity sized and configured to receive only a portion of the substrate therein on which less than all the semiconductor devices are mounted;
   the molding device being operative to encapsulate only the semiconductor devices enclosed by the mold cavity with a molding compound; and
   an indexing mechanism operative to move the substrate to bring another portion of the substrate on which others of the semiconductor devices are mounted into a position to be enclosed by the mold cavity for encapsulation.

2. The molding system as claimed in claim 1, including a temperature control passage adjacent to the molding device through which the substrate is transportable for bringing the substrate to a predetermined temperature.

3. The molding system as claimed in claim 2, wherein the temperature control passage is a heat tunnel.

4. The molding system as claimed in claim 2, wherein the temperature control passage is operative to pre-heat the substrate prior to molding.

5. The molding system as claimed in claim 2, wherein the temperature control passage is operative to perform post-mold curing of the substrate after molding.

6. The molding system as claimed in claim 1, wherein a molding surface of the molding device substantially encloses a surface of a molding section of the substrate.

7. The molding system as claimed in claim 6, wherein the molding surface is operative to encapsulate a molding section of the substrate with a block of molding material covering a majority of the molding section.

8. The molding system as claimed in claim 6, wherein the molding surface is operative to encapsulate a molding section of the substrate with an ray molding material covering individual semiconductor dice located within the molding section.

9. The molding system as claimed in claim 1, wherein the indexing means includes a clamp operative to grip a side of the substrate to move it.

10. The molding system as claimed in claim 1, wherein the indexing means includes a pin operative to engage a corresponding pinhole in the substrate to position it.

11. The molding system as claimed in claim 1, wherein the indexing means extends adjacent to the molding device and is substantially parallel with a traveling path of the substrate.

12. The molding system as claimed in claim 1, including a cleaning device located adjacent to the molding device which is operative to clean at least a molding surface of the molding device.

13. The molding system as claimed in claim 12, wherein the cleaning device is operative to clean the at least one molding surface after molding of each substrate comprising a plurality of molding sections is completed.

14. A molding system as claimed in claim 1, wherein the molding cavity is sized and configured to encapsulate the semiconductor devices enclosed thereby into a single block of molding compound.

15. A molding system as claimed in claim 1, wherein the molding cavity is sized and configured to encapsulate one or more semiconductor devices enclosed thereby into separate blocks of molding compound.

* * * * *